United States Patent [19]
Yamamoto et al.

[11] Patent Number: 5,444,744
[45] Date of Patent: Aug. 22, 1995

[54] PHASE LOCKED LOOP FOR SYNCHRONIZING WITH CARRIER WAVE

[75] Inventors: Yuji Yamamoto; Kiichiro Akiyama, both of Kawagoe, Japan

[73] Assignee: Pioneer Electronic Corporation, Tokyo, Japan

[21] Appl. No.: 161,890

[22] Filed: Dec. 3, 1993

[30] Foreign Application Priority Data
Dec. 14, 1992 [JP] Japan .................. 4-333311

[51] Int. Cl.$^6$ ............................ H03D 3/24
[52] U.S. Cl. ..................... 375/376; 329/307
[58] Field of Search .......... 375/81, 120; 307/269; 329/307, 308, 325; 455/260

[56] References Cited

U.S. PATENT DOCUMENTS

| | | | |
|---|---|---|---|
| 3,908,115 | 9/1975 | Waggener | 375/81 |
| 4,085,288 | 4/1978 | Viswanathan | 375/120 |
| 4,686,689 | 8/1987 | Rorden | 375/81 |
| 4,744,094 | 5/1988 | McCarren | 375/81 |
| 4,888,564 | 12/1989 | Ishigaki | 375/120 |
| 4,975,660 | 12/1990 | Svenson | 375/120 |
| 5,164,966 | 11/1992 | Hershberger | 375/120 |

FOREIGN PATENT DOCUMENTS 0004956 1/1981 Japan .................. 375/120

Primary Examiner—Stephen Chin
Assistant Examiner—T. Ghebretinsae
Attorney, Agent, or Firm—Kane, Dalsimer, Sullivan, Kurucz, Levy, Eisele and Richard

[57] ABSTRACT

A phase locked loop circuit for synchronizing with carrier wave includes: a variable divider for generating a first reference signal and a second reference signal whose frequency is same as the frequency of the first reference signal and whose phase is shifted by 90 degrees with respect to the phase of the first reference signal, the variable divider varying the frequencies of the first reference signal and the second reference signal in accordance with a control signal; a first multiplier for multiplying an input signal by the first reference signal; an exclusive OR circuit for operating an exclusive OR of the input signal and the output signal of the first multiplier; a phase comparator for receiving the first reference signal, the second reference signal and the output signal of the exclusive OR circuit, and detecting a value and a direction of a phase difference between the input signal and the first reference signal to produce phase comparison signal including series of clock pulses whose number corresponding to the value of the phase difference and indicative of the direction of the phase difference; and a loop filter for producing the control signal on the basis of the phase comparison signal.

13 Claims, 12 Drawing Sheets

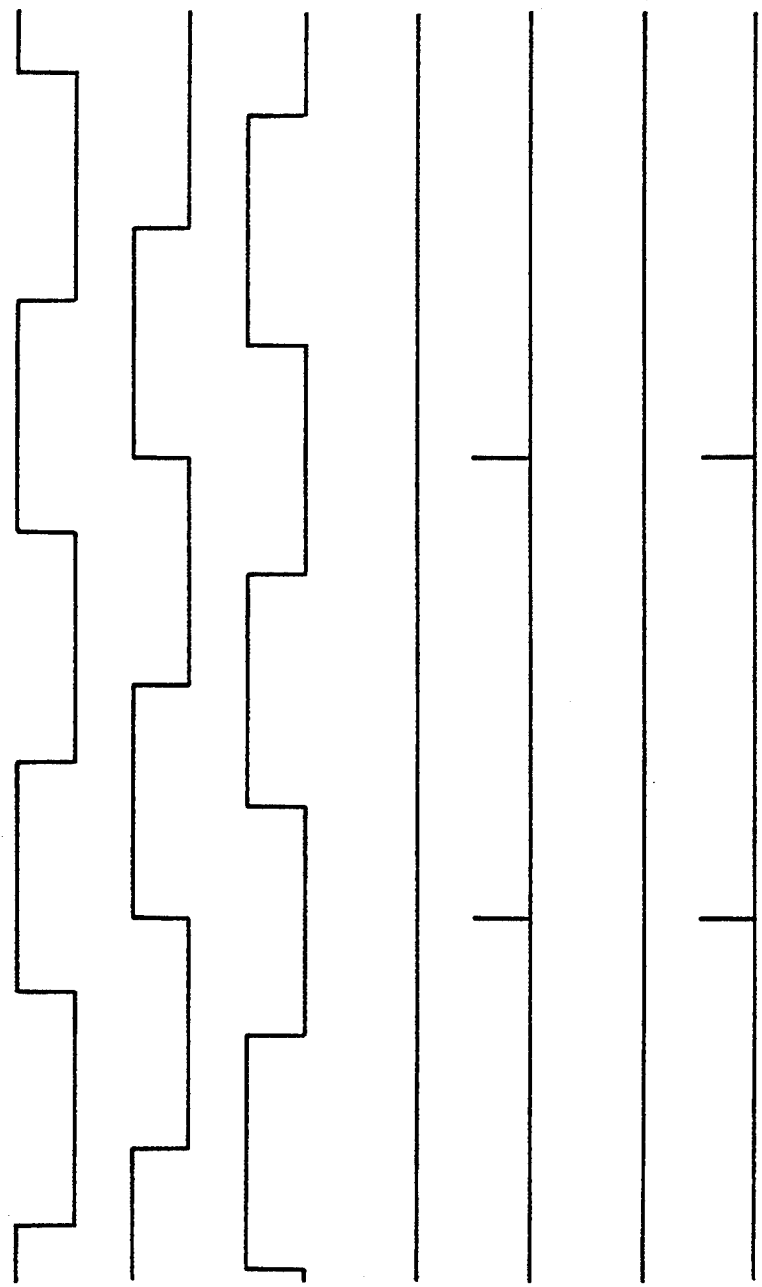

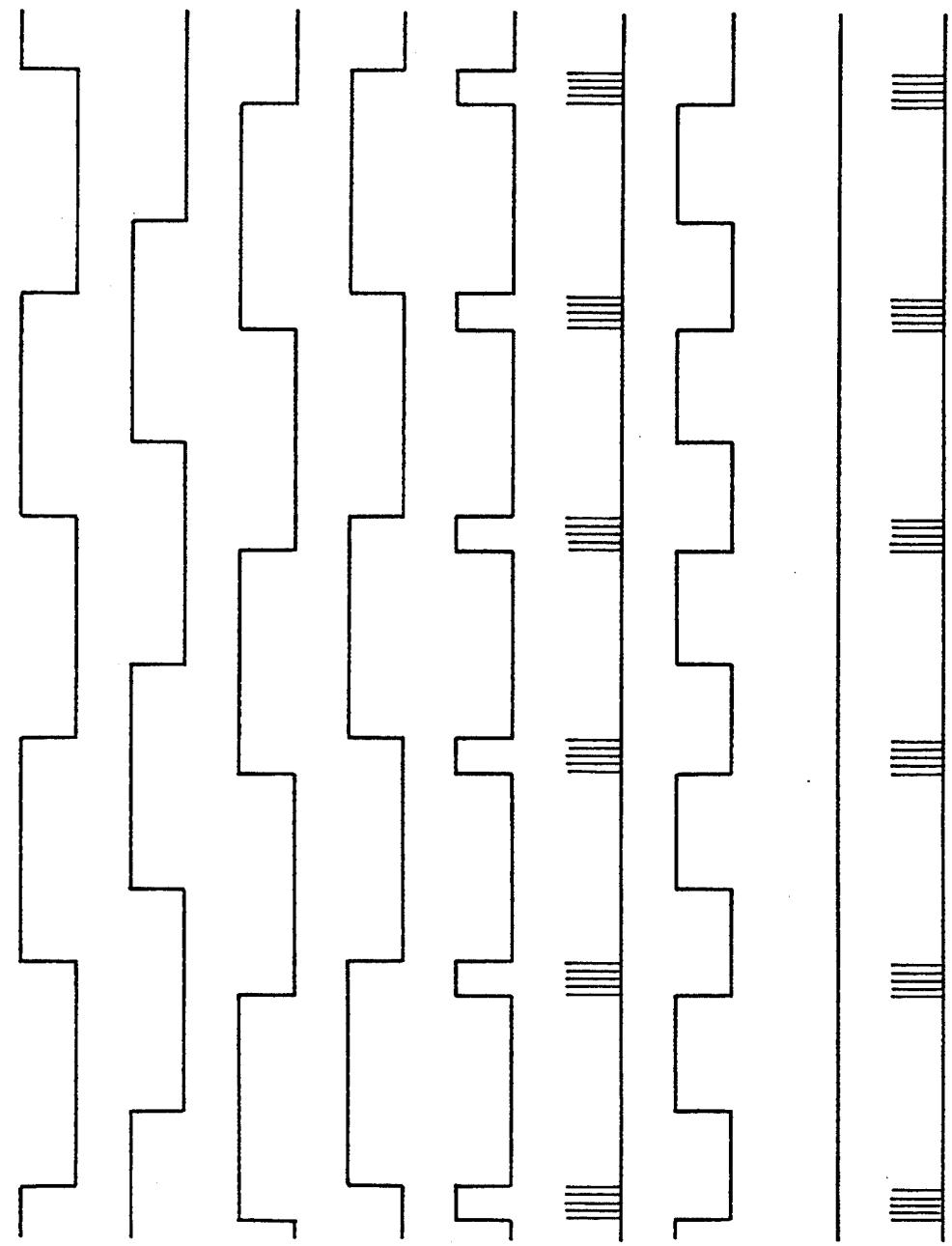

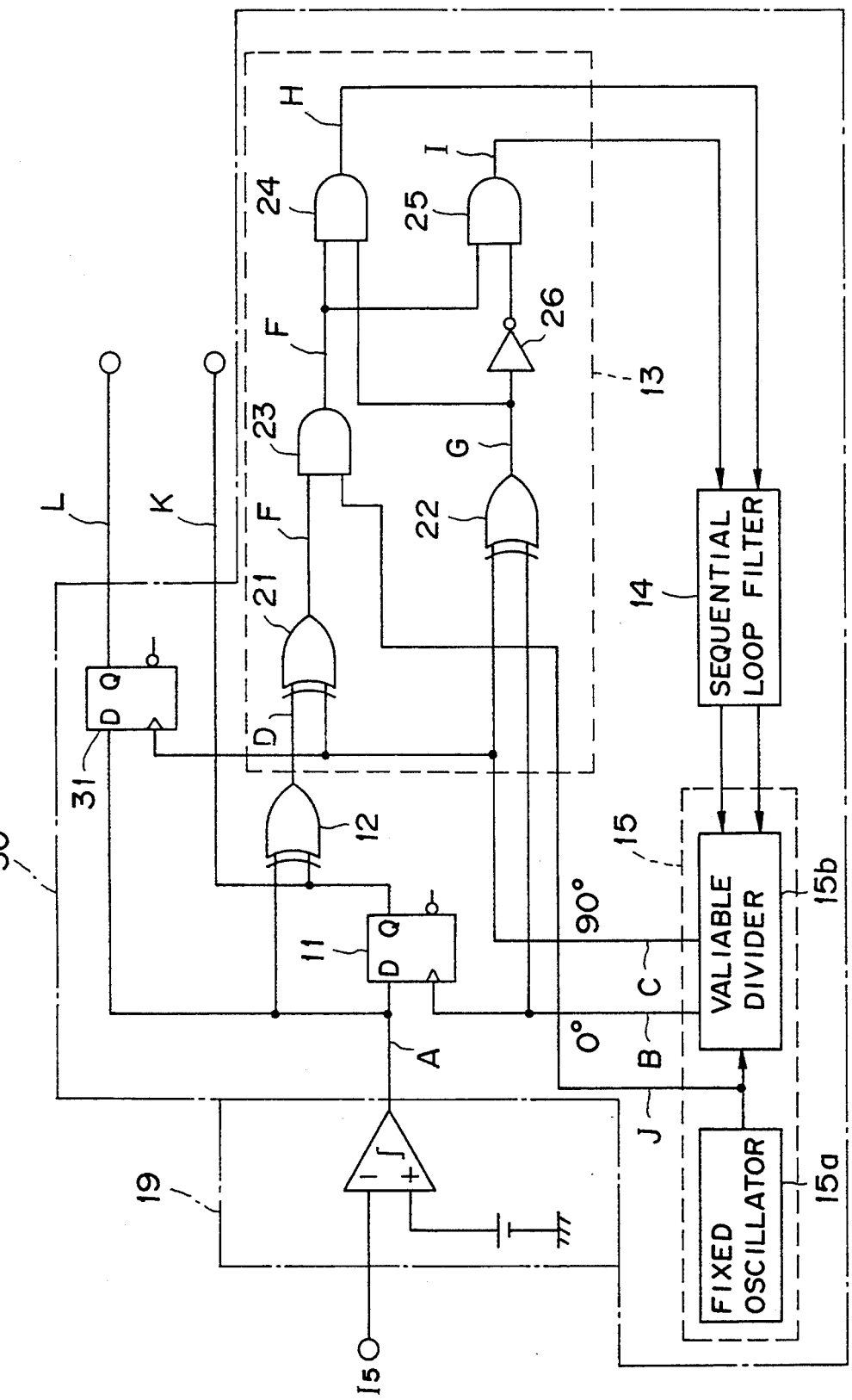

PHASE LOCKED LOOP FOR SYNCHRONIZING WITH CARRIER WAVE

BACKGROUND OF THE INVENTION

1. Field of the Invention

This invention generally relates to a PLL (Phase-Locked Loop) circuit for synchronizing with a carrier wave, and more particularly to a PLL circuit, such as a Costas loop type DPLL (Digital PLL) circuit, suitable for detecting a carrier wave in an FM multiplexed data broadcasting in which digital signal such as an ARI (Autofahrer Rundfunk Information) signal for identifying traffic information or an RDS (Radio Data System) signal for transmitting a message of digital data is multiplexed to FM signal.

2. Description of the Prior Art

As a traffic information system for relieving a traffic snarl, there is known an ARI broadcasting system. In the ARI broadcasting system, a sub-carrier of 57 kHz is constantly multiplexed into FM radio wave of broadcasting station so as to identify the station which is broadcasting traffic information. In addition, in that system, a DK signal and a BK signal, obtained by amplitude-modulating the sub-carrier by predetermined frequencies, are multiplexed into the radio wave so as to provide information relating to a commence or end of the traffic information, or a region in which traffic information is broadcasted.

As a similar system, there is known an RDS system in which digital data identifying broadcasting stations, etc., are multiplexed into FM radio wave using a sub-carrier of 57 kHz. Data to be multiplexed in the RDS system is configured by a plurality of groups consist of 104 bits data, and various messages mainly used for selection of broadcasting station are standardized. The transmission rate of RDS data is 1.1875 kbit/sec, and RDS data is encoded by a differential encoding. Then, clock signal of 1.1875 kHz is modulated by a bi-phase shift keying using encoded data. Further, sub-carrier of 57 kHz is modulated by a carrier suppressed amplitude modulation using modulated data of bi-phase shift keying. Double sideband (DSB) signal of the modulated data is multiplexed to audio data, and the multiplexed data is transmitted. Sub-carrier of RDS data is designed so as to be in phase or in orthogonal phase (shifted by 90 degrees) with third harmonic of a pilot signal (19 kHz) indicating a stereo broadcasting. When it is required to maintain coexistence of ARI signal and RDS modulated signal, the two signals are multiplexed so that the frequencies thereof equal to each other and the phase relation of them becomes in orthogonal with each other (shifted by 90 degrees).

FIG. 1 shows a frequency spectrum in which RDS signal and ARI signal ($S_2$) are multiplexed to FM audio signal ($S_1$). FIG. 2 shows a basic construction of a receiver of FM multiplexed broadcasting (RDS). As seen from FIG. 1, RDS modulation signal is allocated around the frequency band of sub-carrier of 57 kHz with small magnitude level so as not to disturb audio signal in audio frequency band.

In the FM multiplexed data receiver, as shown in FIG. 2, an antenna 51 receives the transmitted radio wave of FM multiplexed broadcasting. From the radio wave received by the antenna 51, a desired broadcasting station is selected by a front end 52. The signal selected by the front end 52 is successively supplied to an IF (Intermediate Frequency) amplifier 53, an FM detector 54 and a multiplexer 55, and output from the multiplexer demodulating circuit (MPX) 55. In a case where the audio signal is a stereo signal, audio signals of Left-channel and Right-channel are output from the MPX 55. The detected signal from the FM detector 54 is also supplied to a filter 56 in which RDS modulation signal having frequency component of sub-carrier 57 kHz is extracted. On the basis of the extracted signal, an RDS decode/clock generate unit 57 generates a clock signal and demodulates RDS data using the generated clock signal. The demodulated RDS data is supplied to a controller 60 via a group-block period/error detect unit 58 and an error correction unit 59. The controller 60 analyzes code information of the RDS data and stores it into a RAM 61. Further, the controller 60 controls the selection of broadcasting station in the front end 52 in accordance with instruction from an operation unit 62.

RDS data is reproduced by the above-described receiver by demodulating RDS modulation signal. However, this RDS modulation signal cannot be demodulated by a simple PLL circuit. Namely, the frequency of the sub-carrier cannot be extracted by a simple PLL circuit because DSB signal thereof has such a characteristics that the phase of the sub-carrier reverses at zero-cross points of envelop of the DSB signal. Therefore, a Costas loop type DPLL circuit suitable for digital signal processing is utilized as a PLL circuit for synchronization of sub-carrier in the demodulating circuit of RDS modulation signal.

FIG. 3 shows a construction of a Costas loop type DPLL circuit. As shown in FIG. 3, the Costas loop type DPLL circuit 70 includes multipliers (D-FF) 71 and 72, a phase comparator 73, a sequential loop filter 74 and a voltage controlled oscillator (VCO) 75. The VCO 75 includes a fixed oscillator 75a and a variable divider 75b. The variable divider 75b divides clock signal output from the fixed oscillator 75a in accordance with the output signals of the sequential loop filter 74 to produce a first reference signal B having the same frequency as the input signal and in phase with the input signal, a second reference signal C having the same frequency as the input signal and whose phase is shifted by 90 degrees from that of the input signal and a synchronization control signal E synchronous with the first reference signal B. As seen from FIG. 3, the RDS modulation signal input via the input terminal $I_{in}$ is converted to a square wave by a comparator 69, and the converted signal A is supplied to the multipliers 71 and 72 in the Costas loop type DPLL circuit 70.

The first reference signal B is supplied to the multiplier 71 as a sampling signal while the second reference signal C is supplied to the multiplier 72 as a sampling signal. The A/D converted signal A from the comparator 69 is sampled by the multipliers 71 and 72, and the sampled signals are supplied to the phase comparator 73. The phase comparator 73 has two output terminals respectively output phase precedence signal and phase lag signal, and these output signals are supplied to the sequential loop filter 74. The phase comparator 73 outputs, from one of the two output terminals, pulses in phase with the sub-carrier and representing the phase precedence or phase lag. The sequential loop filter 74 counts the pulses output from the phase comparator 73 to control the variable divider 75b. In response to the control signal from the sequential loop filter 74, the frequency of the reference signals output from the variable divider 75b approaches to the frequency of the sub-carrier, and finally coincides with the frequency of the sub-carrier. When the frequency of the signal from the variable divider 75b coincides with the frequency of the sub-carrier, the Costas loop type DPLL circuit 70 becomes locked. In this locked state, the multiplier 71 outputs an in-phase synchronizing signal in phase with the sub-carrier while the multiplier 72 outputs an orthogonal synchronizing signal in orthogonal phase with the sub-carrier. Thus synchronizing signals are detected.

The above phase comparator 73 includes an EX-OR circuit 73a, an inverter circuit 73b and AND circuits 73c and 73d. The output signals of the multipliers 71 and 72 are supplied to the EX-OR circuit 73a. A phase comparison signal D output from the EX-OR circuit 73a is input to the AND circuit 73c as it is and input to the AND circuit 73d after being inverted by the inverter 73b. The AND circuits 73c and 73d responsive to the synchronization control signal E output a positive-direction phase difference signal F and a negative-direction phase difference signal G, respectively.

The sequential loop filter 74 is constructed as shown is FIG. 4. The positive-direction phase difference signal F and the negative-direction phase difference signal G, respectively indicating phase precedence and phase lag, are stacked in N-bit registers 81 and 82, and the sum of the signals is stacked in the M-bit register 84 via an OR circuit 83. If one of the N-bit registers 81 and 82 becomes full before or simultaneously with the M-bit register 84, the N-bit registers 81 and 82 output a reset pulse to reset all the registers. When the Costas loop type DPLL circuit 70 is in locked state, the M-bit register 84 tends to be full and frequency of reset pulse decreased. Therefore, the synchronization detection is stabilized. This type of filter is called "N-before-M filter" and generally used in DPLL circuits.

In a DPLL circuit, RDS modulation signal is required to be highly accurately demodulated, and hence it is necessary that phase comparison signal produced by phase comparator is highly accurate. However, the above described Costas loop type DPLL circuit detects phase difference by sampling the input signal A for one period, and hence the phase comparator outputs same phase comparison signal regardless of the value of the phase difference. This will be described below with reference to FIGS. 5A–5G and FIGS. 6A–6G. FIGS. 5A–5G show timing charts of respective signals A to G in a case where phase difference between the input signal A and the first reference signal B is large. As seen from FIGS. 5A–5G, when the phase difference between the input signal A and the first reference signal B is large, the output signal of the multiplier 71 becomes high level and the output signal of the multiplier 72 becomes high level, and hence the phase comparison signal D becomes low level. Therefore, the AND circuit 73d outputs no pulse and the positive-direction phase difference signal F maintains low level. Alternately, the AND circuit 73c outputs, as the negative-direction phase difference signal G, pulse signal synchronous with the synchronization control signal E. The sequential loop filter 74 detects this pulse signal and outputs the control signal to make the DPLL circuit locked state.

FIGS. 6A–6G show timing charts of respective signals A to G in a case where the direction of the phase difference between the input signal A and the first reference signal B is same as the case of FIGS. 5A–5G but the phase difference value is smaller than that case. As seen from FIGS. 6A–6G, when the phase difference between the input signal A and the first reference signal B is small, the phase comparison signal D becomes low level, and the output signals of the AND circuits 73c and 73D are identical to that in the case of FIGS. 5A–5G.

As mentioned above, the Costas loop type DPLL circuit shown in FIG. 3 is capable of producing phase difference signal of only high or low level. In other words, this kind of DPLL circuit can only discriminate whether the phase of the reference signal is preceding or lagged, and cannot detect how much the phase difference value is. For this reason, in this DPLL circuit, the VCO circuit varies the frequency of reference signal for a fixed value regardless of the value of the phase difference. Therefore, in some cases, the VCO circuit excessively varies the frequency of the reference signal even though the phase difference is small. This makes the performance of the DPLL circuit unstable.

SUMMARY OF THE INVENTION

It is an object of the present invention to provide a phase locked loop for synchronizing with carrier wave capable of precisely detecting phase difference to stabilize the performance thereof.

According to one aspect of the present invention, there is provided a phase locked loop circuit for synchronizing with carrier wave including: a variable divider for generating a first reference signal and a second reference signal whose frequency is same as the frequency of the first reference signal and whose phase is shifted by 90 degrees with respect to the phase of the first reference signal, the variable divider varying the frequencies of the first reference signal and the second reference signal in accordance with a control signal; a first multiplier for multiplying an input signal by the first reference signal; an exclusive OR circuit for operating an exclusive OR of the input signal and the output signal of the first multiplier; a phase comparator for receiving the first reference signal, the second reference signal and the output signal of the exclusive OR circuit, and detecting a value and a direction of a phase difference between the input signal and the first reference signal to produce phase comparison signal including series of clock pulses whose number corresponding to the value of the phase difference and indicative of the direction of the phase difference; and a loop filter for producing the control signal on the basis of the phase comparison signal.

The nature, utility, and further features of this invention will be more clearly apparent from the following detailed description with respect to preferred embodiment of the invention when read in conjunction with the accompanying drawings briefly described below.

BRIEF DESCRIPTION OF THE DRAWINGS

FIGS. 6A–6G are timing charts of respective signals A to G shown in FIG. 3 in a case where phase difference between the input signal A and the first reference signal B is small;

FIGS. 10A–10I are timing charts of respective signals A to I shown in FIG. 8 in a case where phase difference between the input signal A and the first reference signal B is small;

FIG. 12 is a diagram showing a construction of a PLL circuit according to second embodiment of the present invention.

DESCRIPTION OF THE PREFERRED EMBODIMENT

Outline of the Invention

Before describing preferred embodiments, an outline of the present invention will be firstly described.

Figure 1:
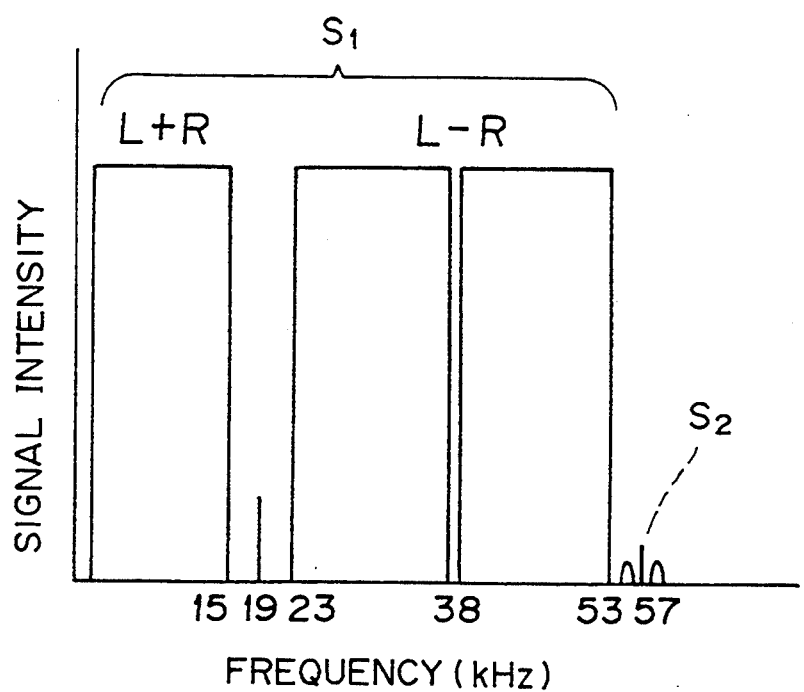
FIG. 1 is a diagram showing a frequency spectrum of FM audio signal in which RDS signal and ARI signal are multiplexed.
Figure 2:
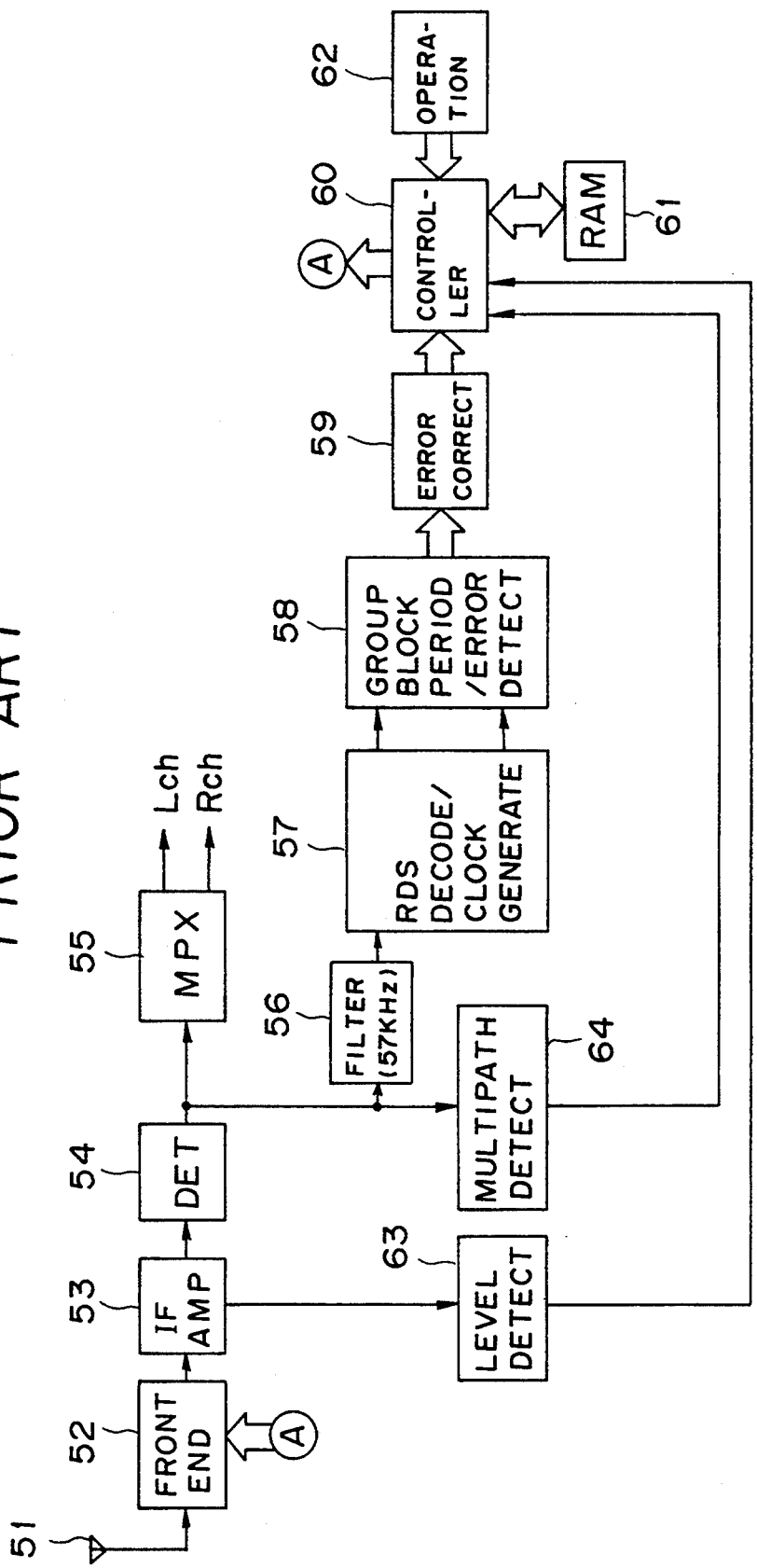
FIG. 2 is a block diagram showing a basic construction of an FM multiplexed data (RDS) receiver.
Figure 3:
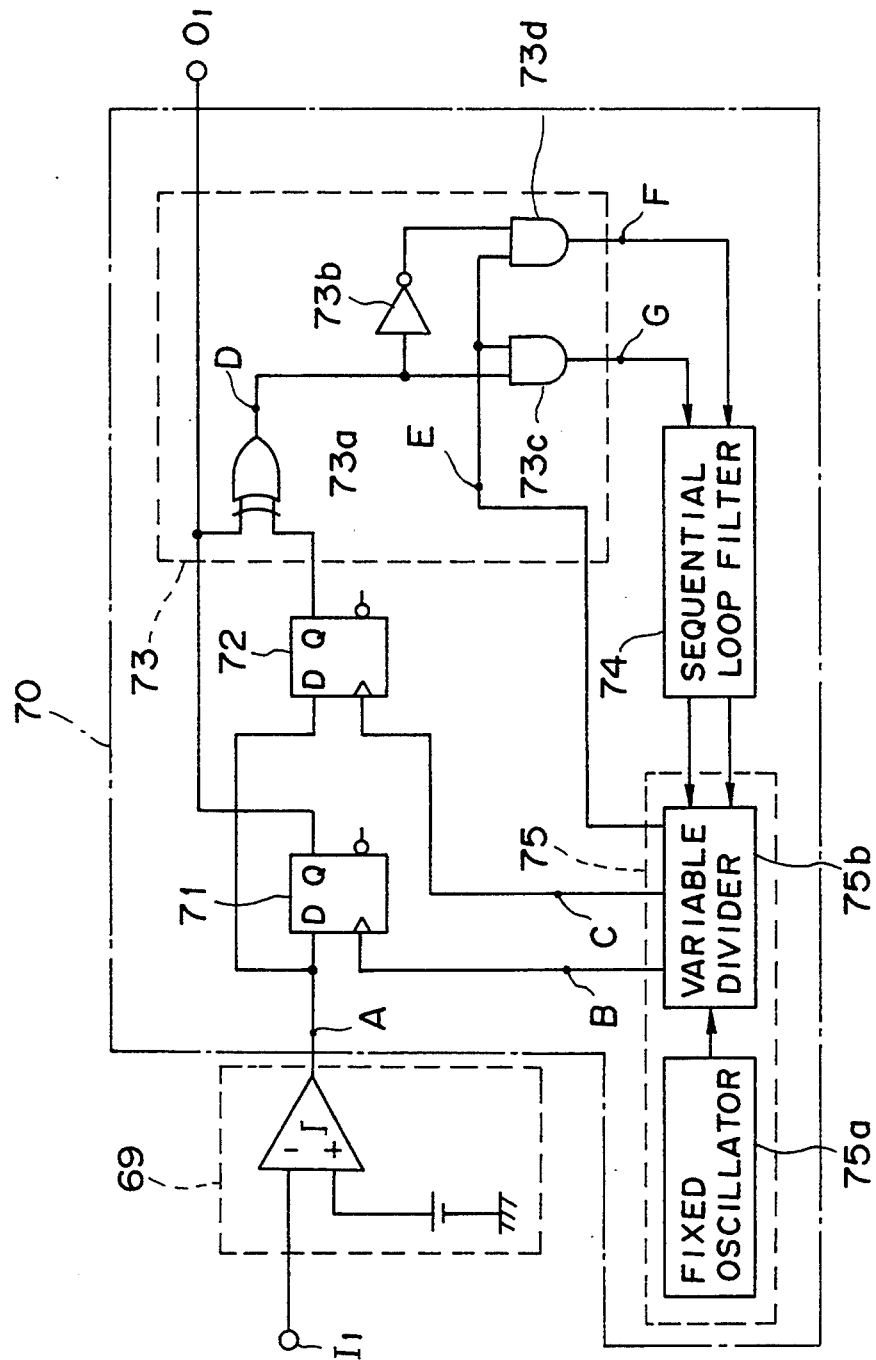
FIG. 3 is a diagram showing a construction of a Costas loop type DPLL circuit.
Figure 4:
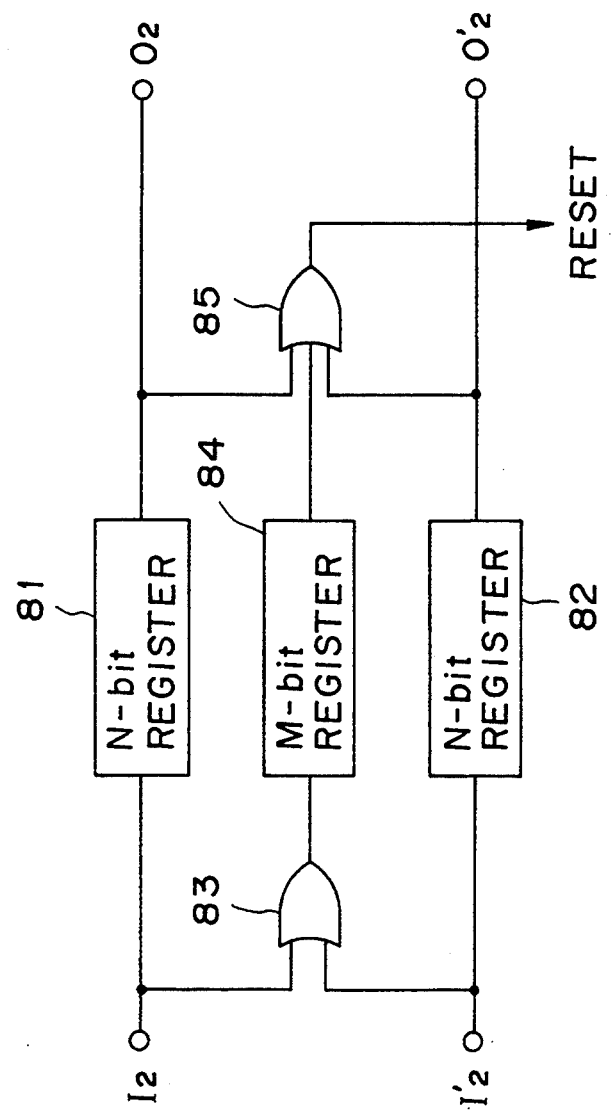
FIG. 4 is a diagram showing a construction of the sequential loop filter shown in FIG. 3.
Figures 5A, 5B, 5C, 5D, 5E, 5F, 5G:
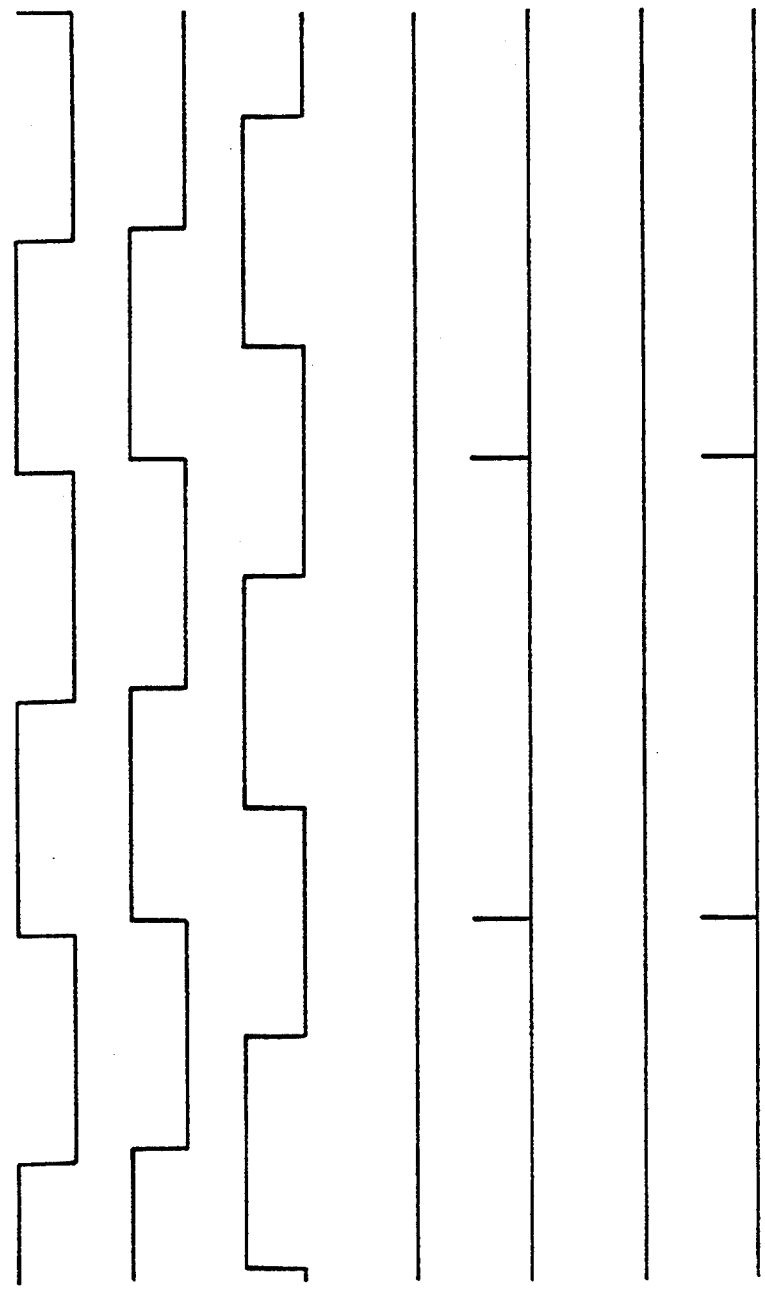
FIGS. 5A–5G are timing charts of respective signals A to G shown in FIG. 3 in a case where phase difference between the input signal A and the first reference signal B is large.
Figure 7:
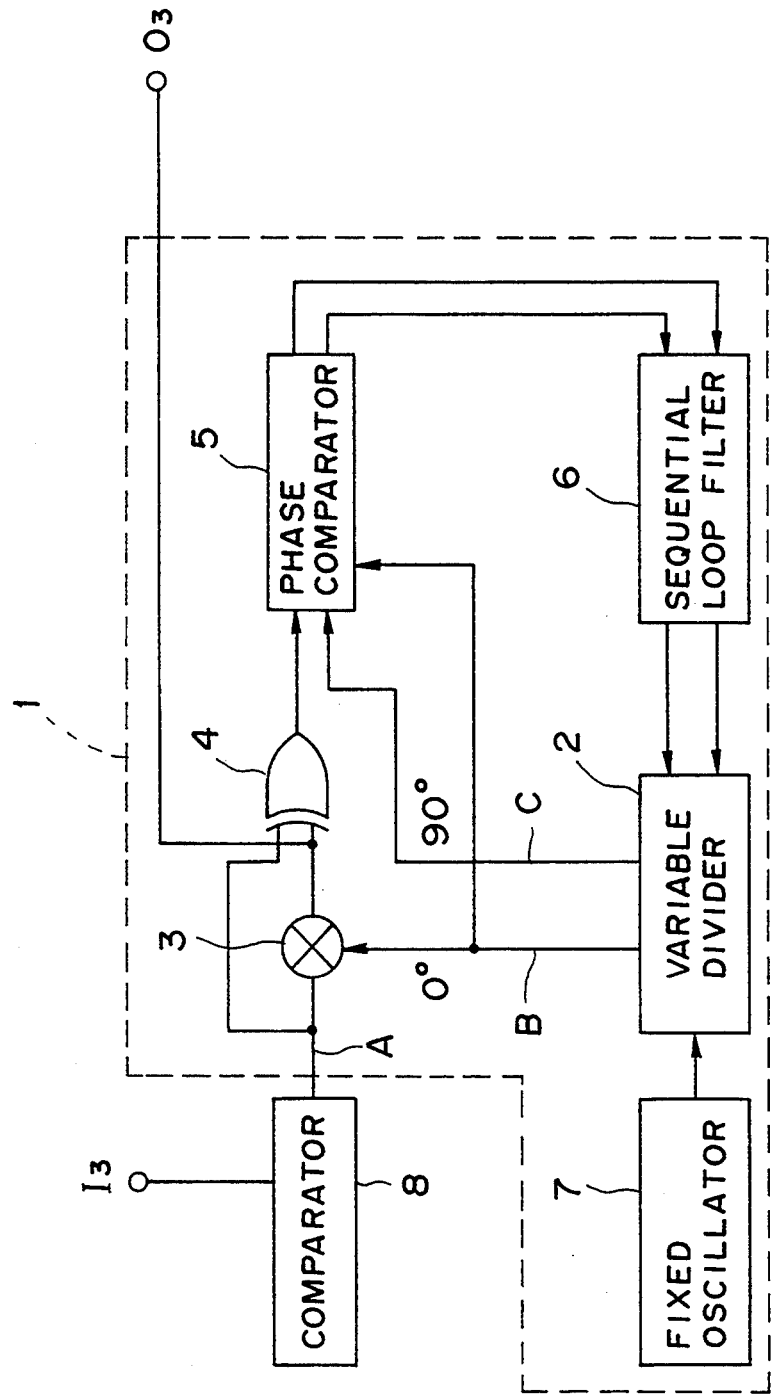
FIG. 7 is a block diagram showing a basic construction of a PLL circuit according to the present invention.

FIG. 7 is a block diagram showing a PLL circuit for synchronizing with carrier wave. As seen from FIG. 7, a PLL circuit 1 includes a variable divider 2, a multiplier 3, an EX-OR circuit 4, a phase comparator 5, a sequential loop filter 6 and a fixed oscillator 7. The variable divider 2 receives a reference clock signal from the fixed oscillator 7, and outputs a first reference signal B and a second reference signal C whose frequency is same as that of the first reference signal B and whose phase is shifted by 90 degrees with respect to the phase of the first reference signal B. The variable divider 2 is capable of varying the frequency of the first and the second reference signals output therefrom in accordance with a control signal from the sequential loop filter 6. Numeral 8 denotes a comparator which converts analog signal input via input terminal I₃ to a digital input signal A and supplies it to the DPLL circuit 1. The multiplier 3 samples the digital input signal A in accordance with the first reference signal B. The EX-OR circuit 4 operates an exclusive OR of the digital input signal A and the output signal of the multiplier 3. The phase comparator 5 receives the first reference signal B, the second reference signal C and the output signal of the EX-OR circuit 4, and detects a value and a direction of the phase difference between the input digital signal A and the first reference signal B to output a phase comparison signal including clock pulses representing the value of the phase difference and indicative of the direction of the phase difference. The sequential loop filter 6 produces the control signal of the variable divider 2 in accordance with the phase comparison signal.

Next, an operation of the PLL circuit 1 will be described in more detail. The multiplier 3 samples the input digital signal A at the timings of the first reference signal B to produce a signal indicating direction of phase difference between the input digital signal A and the first reference signal B. The EX-OR circuit 4 operates exclusive OR of the input digital signal A and the output signal of the multiplier 3 to produce an inverted signal of the input digital signal A. The phase comparator 5 outputs clock pulses during the period of the phase difference and outputs the clock pulses as the phase comparison signal after defining the direction of the phase difference. The sequential loop filter 6 generates the control signal corresponding to the number of the clock pulses in the phase comparison signal, and supplies it to the variable divider 2 to vary the frequency of the first and the second reference signals B and C. Therefore, the phases of the input digital signal A and the first reference signal B are controlled in accordance with the number and the resolution of the clock pulses in the phase comparison signal.

Next, preferred embodiments of the present invention will be described below with reference to the accompanying drawings.

1st Embodiment

Figure 8:
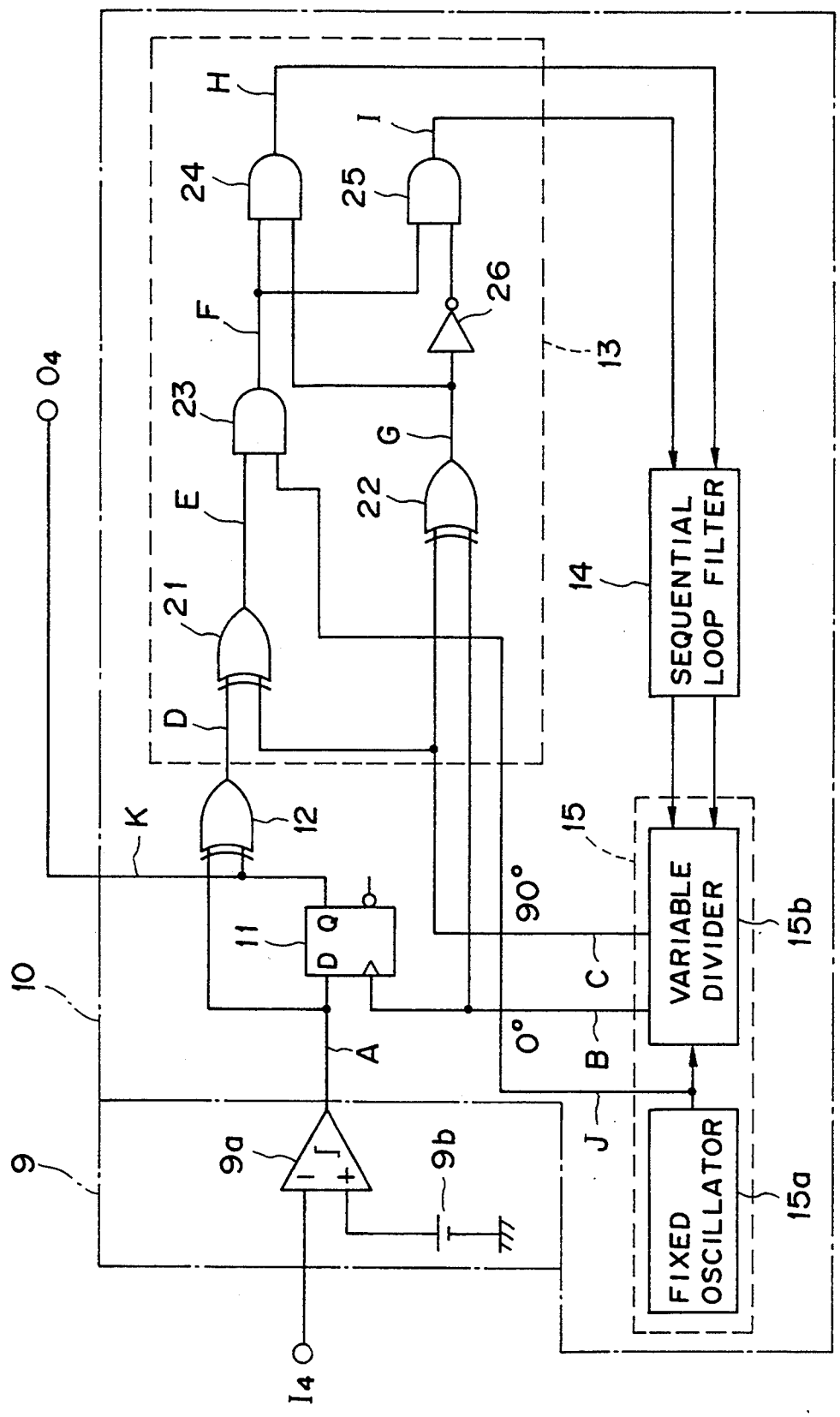
FIG. 8 is a diagram showing a construction of a DPLL circuit according to first embodiment of the present invention.

FIG. 8 is a diagram showing a construction of a DPLL circuit according to first embodiment of the present invention. As shown in FIG. 8, a DPLL circuit 10 according to the first embodiment of the present invention includes a multiplier 11, a first EX-OR circuit 12, a phase comparator 13, a sequential loop filter 14 and a VCO circuit 15. FIG. 8 further shows a comparator 9 to convert input analog signal to a digital input signal A. A D-FF (Flip-Flop) is utilized as the multiplier 11 which samples the input signal A supplied to the D-input terminal at the timings of the reference signal B supplied to the CK-input terminal. The VCO circuit 15 includes a fixed oscillator 15a and a variable divider 15b. The VCO circuit 15 divides a reference clock J generated by the fixed oscillator 15b in correspondence with an output signal of the sequential loop filter 14, and outputs a first reference signal A to be synchronized with the input signal A and a second reference signal C whose frequency is same as that of the first reference signal B and whose phase is shifted by 90 degrees with respect to the phase of the first reference signal B. The phase comparator 13 includes a second and third EX-OR circuits 21 and 22, a first to third AND circuits 23 to 25, and an inverter circuit 26.

The comparator 9 having an operations amplifier 9a supplied with a reference voltage 9b produces the A/D converted input signal A, and supplies it to the multiplier 11 and the first EX-OR circuit 12. The multiplier 11 receives the input signal A and the first reference signal B output from the variable divider 15b, samples the input signal A at the timings of the first reference signal B, and outputs the sampled signal. The first EX-OR circuit 12 receives the input signal A and the output signal of the multiplier 11, and supplies a signal D representing direction of the phase difference to the phase comparator 13. In the phase comparator 13, the second EX-OR circuit 21 receives the output signal D of the first EX-OR circuit 12 and the second reference signal C from the variable divider 15b, and outputs a phase comparison signal E. The first AND circuit 23 receives the phase comparison signal E from the second EX-OR circuit 21 and the reference clock J from the fixed oscillator 15a, and outputs a phase comparison pulse signal F representing information of phase difference. The phase comparison pulse signal F includes series of clock pulses whose number corresponds to the value of the phase difference. The third EX-OR circuit 22 receives the first and second reference signals B and C from the variable divider 15b, and outputs a phase direction signal G. The second AND circuit 24 receives the phase comparison pulse signal F and the phase direction signal G, and outputs a positive-direction phase difference signal H. The third AND circuit 25 receives the phase comparison pulse signal F and an inverted signal of the phase direction signal G inverted by the inverter circuit 26, and outputs a negative-direction phase difference signal I.

Next, the operation of the DPLL circuit 10 will be described in detail. FIGS. 9A–9I, 10A–10I and 11A–11I are timing charts of the respective signals in the DPLL circuit 10. FIGS. 9A–9I represent a case where phase lag of the input signal A with respect to the first reference signal B is large, and FIGS. 10A–10I represent a case where phase lag of the input signal A with respect to the first reference signal B is small. FIGS. 11A–11I represent a case where the phase of the input signal A is preceding in phase with respect to the first reference signal B. By referring to the drawings, the input signal A is sampled by the multiplier 11 at the timings of the first reference signal B output from the variable divider 15b. Then, an exclusive OR of the input signal A and the output signal of the multiplier 11 is operated in the first EX-OR circuit 12 to produce a signal D including information of lock direction of the DPLL circuit 10. The multiplier 11 outputs high level signal when the phase difference between the input signal A and the first reference signal B is close to 0 degree and outputs low level signal when the phase difference is close to 180 degrees. Accordingly, the first EX-OR circuit 12 outputs a signal having a reversed waveform of the input signal A when the phase difference is close to 0 degree, and outputs a signal having the same waveform as the input signal A when the phase difference is close to 180 degrees.

Figures 9A, 9B, 9C, 9D, 9E, 9F, 9G, 9H, 9I:
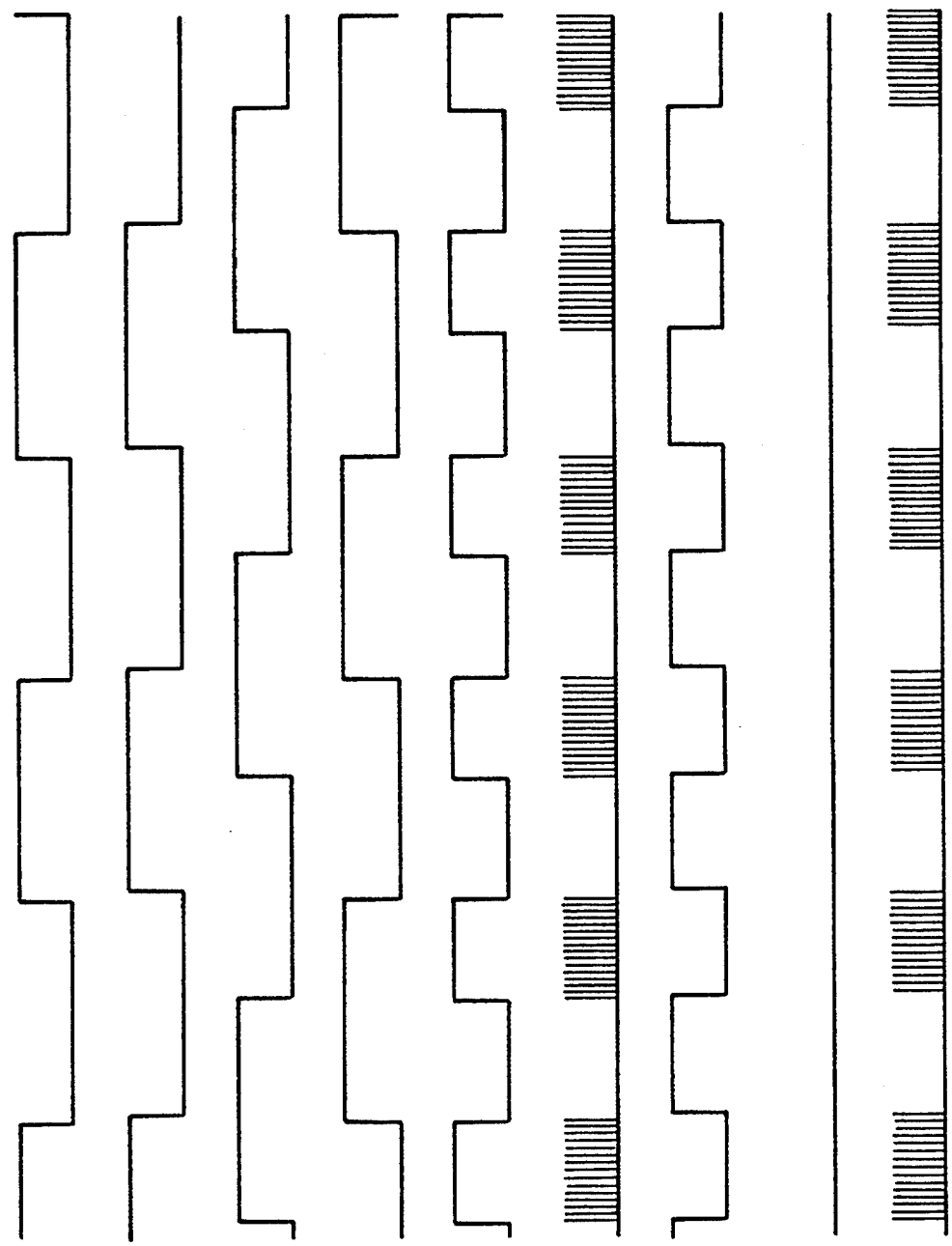
FIGS. 9A–9I are timing charts of respective signals A to I shown in FIG. 8 in a case where phase difference between the input signal A and the first reference signal B is large.
Figures 11A, 11B, 11C, 11D, 11E, 11F, 11G, 11H, 11I:
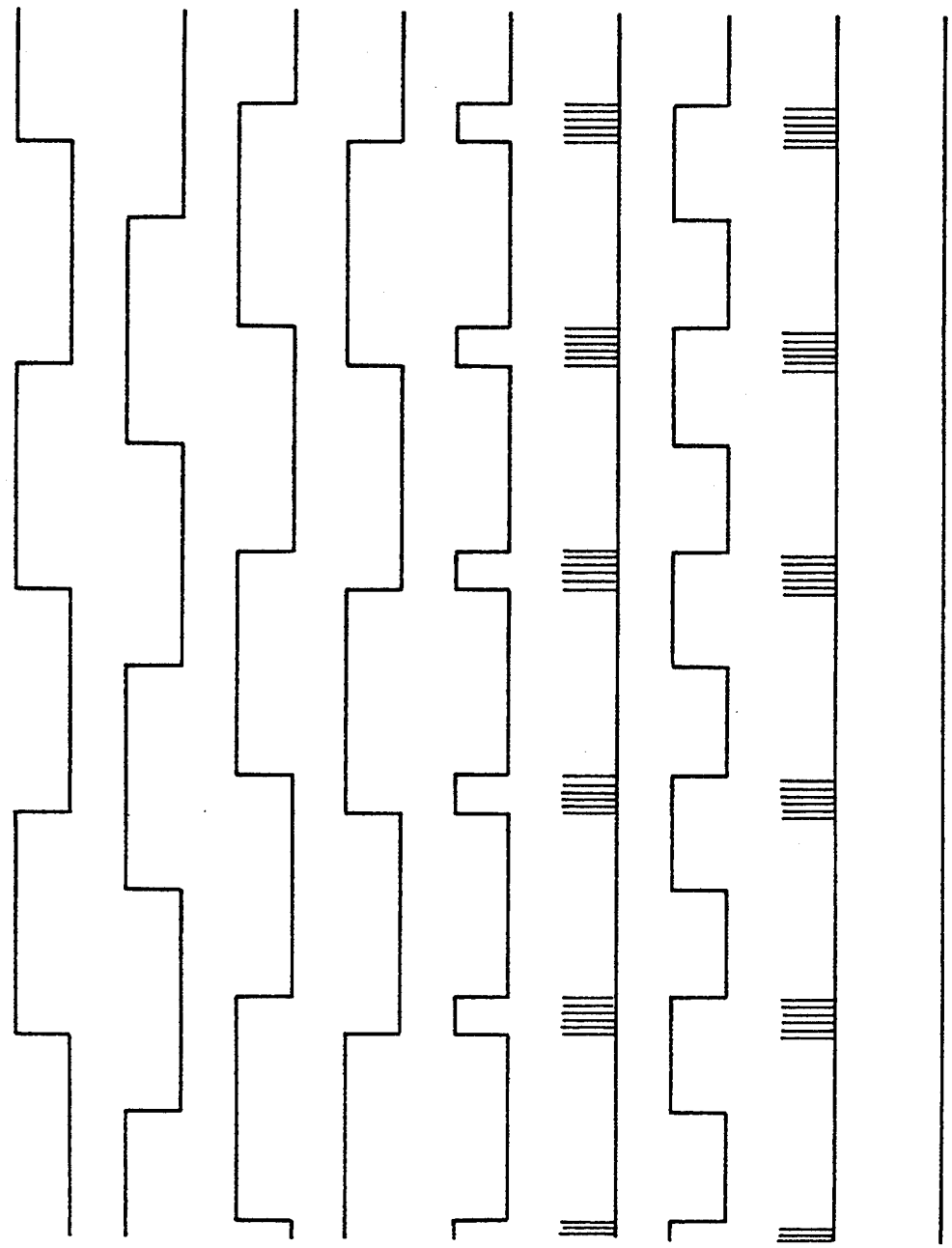
FIGS. 11A–11I are timing charts of respective signals A to I shown in FIG. 8 in a case where phase of the input signal A is preceding with respect to the first reference signal B.

The second EX-OR circuit 21 operates an exclusive OR of the signal D output from the first EX-OR circuit 12 and the second reference signal C having phase difference of 90 degrees between the first reference signal B to produce a phase comparison signal E. In the phase comparison signal E, the time width (high level period in figures) represents a value of the phase difference. The first AND circuit 23 operates an AND of the phase comparison signal E and the reference clock J to produce the phase comparison pulse signal F having clock pulses whose number corresponds to the phase difference. This phase comparison pulse signal F includes information of phase precedence and phase lag. Accordingly, the direction of the phase difference is determined by referring to the signal G output from the third EX-OR circuit 22 using the second and third AND circuits 24 and 25 and the inverter circuit 26. As a result, when the input signal A has a phase lag, the negative-direction phase difference signal I is supplied to the sequential loop filter 14. The negative-direction phase difference signal I includes a series of reference pulses, whose number corresponding to the phase difference, at every half period of the input signal A as shown in FIGS. 9I and 10I. Alternately, when the input signal A has a phase precedence, the positive-direction phase difference signal H is supplied to the sequential loop filter 14. The positive-direction phase difference signal H includes a series of reference pulses, whose number corresponding to the phase difference, at every half period of the input signal A as shown in FIG. 11H. The sequential loop filter 14 produces control signals in correspondence with the number of the clock pulses in the phase difference signal H or I, and supplies it to the variable divider 15b so as to vary the frequency of the first reference signal B to be close to that of the input signal A. As a result, the multiplier 11 outputs a synchronous detection signal of the input signal when the DPLL circuit is locked.

As described above, the DPLL circuit according to this embodiment produces, at every half period of the input signal A, a phase comparison signal including a series of reference clock pulses whose number corresponds to the phase difference, and supplies the phase comparison signal of such a high resolution to the sequential loop filter 14. Therefore, the phase control is precisely performed, thereby stabilizing the performance of the DPLL circuit even if the phase difference is relatively small.

2nd Embodiment

FIG. 12 shows a DPLL circuit for synchronizing with sub-carrier installed in an RDS/ARI signal demodulator, on which the present invention is applied. In FIG. 12, the items identical to that shown in FIG. 8 are denoted by the same reference numerals, and the brief description thereof is omitted.

The DPLL circuit 10 shown in FIG. 8 operates to synchronize with RDS signal when only RDS signal is transmitted, and outputs a baseband signal of the RDS signal obtained by in-phase synchronous detection from the multiplier 11. However, there is a case where RDS signal and ARI signal are simultaneously transmitted. In such a case, they are multiplexed and transmitted so that their phases are orthogonal to each other and the amplitude level of the ARI signal is higher than that of the RDS signal by about 10 dB. Accordingly, when both of ARI signal and RDS signal are transmitted simultaneously, the DPLL circuit 10 shown in FIG. 8 synchronizes with ARI signal.

In view of this, the DPLL circuit 30 of this embodiment is provided with a second multiplier (Flip-Flop) 31. The circuit construction of the DPLL circuit 30 is identical to that of the DPLL circuit 10 except for the provision of the second multiplier 31. The second multiplier 31 receives the input signal A and the second reference signal C output from the variable divider 15b, and samples the input signal A at the timings of the second reference signal C to output an orthogonal-phase synchronous detection signal. When an RDS/ARI modulation signal is input, the DPLL circuit 30 operates to synchronize with the ARI signal. In this case, a baseband signal of the RDS/ARI signal obtained by orthogonal synchronous detection is output from the second multiplier 31. Therefore, the DPLL circuit 30 of this embodiment constantly outputs the baseband signal by providing an RDS/ARI detection circuit. Namely, if ARI signal is included in a transmitted signal, the second multiplier 31 outputs a baseband signal of RDS signal and ARI signal from the terminal L, and if ARI signal is not included in the transmitted signal, the first multiplier 11 outputs baseband signal of RDS signal from the terminal K.

In the above embodiments, the reference clock pulses are generated by the fixed oscillator and supplied to the phase comparator. However, it is possible to provide a clock generator for generating clock pulses of desired frequency within the phase comparator or outside of the DPLL circuit.

As described above, according to the PLL circuit of the present invention, a phase difference signal of high resolution is precisely produced and the phase control is performed. Therefore, a stable synchronization of subcarrier is achieved. In particular, this invention will stabilize detection of FM multiplexed data in the FM multiplexed data broadcasting system using ARI signal for identifying traffic information or RDS signal including message of digital data.

The invention may be embodied on other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning an range of equivalency of the claims are therefore intended to be embraced therein.

What is claimed is:

1. A phase locked loop circuit for synchronizing with carrier wave comprising:
   a fixed oscillator for generating a clock signal including reference clock pulses;
   a variable divider for dividing the clock signal and generating a first reference signal and a second reference signal whose frequency is same as the frequency of the first reference signal and whose phase is shifted by 90 degrees with respect to the phase of the first reference signal, said variable divider varying the frequencies of the first reference signal and the second reference signal in accordance with a control signal;
   a first multiplier for multiplying an input signal by the first reference signal;
   an exclusive OR circuit for operating an exclusive OR of the input signal and an output signal of said first multiplier;
   a phase comparator for receiving the clock signal, the first reference signal, the second reference signal and the output signal of said exclusive OR circuit, and detecting a value and a direction of a phase difference between the input signal and the first reference signal to produce phase comparison signal including a series of clock pulses whose number corresponding to the value of the phase difference and indicative of the direction of the phase difference; and
   a loop filter for producing the control signal on the basis of the phase comparison signal.

2. A phase locked loop circuit according to claim 1, further comprising a second multiplier for multiplying the input signal by the second reference signal.

3. A phase locked loop circuit according to claim 1, wherein said phase comparison signal comprises a positive-direction phase difference signal indicating that the phase of the input signal is preceding the phase of the first reference signal and a negative-direction phase comparison signal indicating that the phase of the input signal is lagged behind the phase of the first reference signal.

4. A phase locked loop circuit according to claim 2, wherein said phase comparison signal comprises a positive-direction phase difference signal indicating that the phase of the input signal is preceding the phase of the first reference signal and a negative-direction phase comparison signal indicating that the phase of the input signal is lagged behind the phase of the first reference signal.

5. A phase locked loop circuit according to claim 3, wherein either of the positive-direction phase comparison signal and the negative-direction phase difference signal includes the series of clock pulses.

6. A phase locked loop circuit according to claim 4, wherein either of the positive-direction phase comparison signal and the negative-direction phase difference signal includes the series of clock pulses.

7. A phase locked loop circuit according to claim 1, wherein said phase comparison signal comprises the series of clock pulses at every half period of the input signal.

8. A phase locked loop circuit according to claim 2, wherein said phase comparison signal comprises the series of clock pulses at every half period of the input signal.

9. A phase locked loop circuit according to claim 1, wherein said variable divider comprising said fixed oscillator for generating reference clock pulses, and said clock pulses in the phase comparison signal are synchronized with the reference clock pulses generated by the fixed oscillator.

10. A phase locked loop circuit according to claim 2, wherein said variable divider comprising said fixed oscillator for generating reference clock pulses, and said clock pulses in the phase comparison signal are synchronized with the reference clock pulses Generated by the fixed oscillator.

11. A phase locked loop circuit for synchronizing with carrier wave comprising:
    a fixed oscillator for generating a clock signal including reference clock pulses;
    a variable divider for dividing the clock signal and generating a first reference signal and a second reference signal whose frequency is the same as the frequency of the first reference signal and whose phase is shifted by 90 degrees with respect to the phase of the first reference signal, said variable divider varying the frequencies of the first reference signal and the second reference signal in accordance with a control signal, the frequency of the first and second reference signal being lower than the frequency of the clock signal;
    a first multiplier for multiplying an input signal by the first reference signal;
    an exclusive OR circuit for operating an exclusive OR of the input signal and an output signal of said first multiplier;
    a phase comparator for receiving the clock signal, the first reference signal, the second reference signal and the output signal of said exclusive OR circuit, and detecting a value and a direction of a phase differences between the input signal and the first reference signal to produce a phase comparison signal including a series of clock pulses whose number corresponding to the value of the phase difference and indicative of the direction of the phase difference, the frequency of the series of clock pulses being identical to the frequency of the reference clock pulses; and
    a loop filter for producing the control signal on the basis of the phase comparison signal.

12. A phase locked loop according to claim 11, wherein said phase comparator comprises means for producing a phase difference signal indicating a value and direction of the phase difference, and means for producing the phase comparison signal from the phase difference signal and the clock signal.

13. A phase locked loop according to claim 12, wherein said phase comparison signal producing means comprises an AND circuit for operating an AND of the phase difference signal and the clock signal.

* * * * *